(12) United States Patent
Ramthun et al.

(10) Patent No.: US 10,725,180 B2
(45) Date of Patent: *Jul. 28, 2020

(54) ARRAY OF INDEPENDENTLY-CONTROLLABLE LASER DIODE BARS FOR SCANNING A LINEAR ILLUMINATION PATTERN

(71) Applicant: Rosemount Aerospace Inc., Burnsville, MN (US)

(72) Inventors: Kent Allan Ramthun, Shakopee, MN (US); Weibin Zhang, Burnsville, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/389,391

(22) Filed: Apr. 19, 2019

(65) Prior Publication Data

US 2019/0293800 A1    Sep. 26, 2019

Related U.S. Application Data

(63) Continuation-in-part of application No. 15/936,095, filed on Mar. 26, 2018.

(51) Int. Cl.
*G01S 17/933* (2020.01)
*H01S 5/40* (2006.01)
(Continued)

(52) U.S. Cl.
CPC .......... *G01S 17/933* (2013.01); *G01S 7/484* (2013.01); *G01S 7/4815* (2013.01);
(Continued)

(58) Field of Classification Search
None
See application file for complete search history.

(56) References Cited

U.S. PATENT DOCUMENTS 6,405,975 B1    6/2002  Sankrithi et al.
6,571,166 B1    5/2003  Johnson et al.
(Continued)

FOREIGN PATENT DOCUMENTS

CA    2464791 A1    10/2004
CA    2737189 A1    10/2011
(Continued)

OTHER PUBLICATIONS

International Civil Aviation Organization, "Aerodrome Standards: Aerodrome Design and Operations", ICAO: Cooperative Development of Operational Safety and Continuing Airworthiness, dated Jul. 1999, 194 pages.

(Continued)

*Primary Examiner* — Jennifer D. Carruth
(74) *Attorney, Agent, or Firm* — Kinney & Lange, P.A.

(57) ABSTRACT

Apparatus and associated methods relate to an array of independently-controllable laser diode bars configured to scan a linearly-structured beam of light upon a scene. Each of the independently-controllable laser diode bars is distributed along a common axis. Each of the independently-controllable laser diode bars is configured to emit a beam of light in an emission direction orthogonal to the common axis. Each of the independently-controllable laser diode bars can be energized in a sequence, thereby scanning the scene in the direction of the common axis.

20 Claims, 12 Drawing Sheets

(51) Int. Cl.
| | | |
|---|---|---|
| *H01S 5/042* | (2006.01) | |
| *H01S 5/024* | (2006.01) | |
| *G02B 27/30* | (2006.01) | |
| *G02B 3/00* | (2006.01) | |
| *G01S 7/481* | (2006.01) | |
| *G01S 7/484* | (2006.01) | |
| *G02B 3/06* | (2006.01) | |
| *G08G 5/00* | (2006.01) | |
| *G08G 5/04* | (2006.01) | |

(52) U.S. Cl.
CPC .......... *G01S 7/4817* (2013.01); *G02B 3/0062* (2013.01); *G02B 3/06* (2013.01); *G02B 27/30* (2013.01); *H01S 5/02469* (2013.01); *H01S 5/0425* (2013.01); *H01S 5/4075* (2013.01); *G08G 5/0078* (2013.01); *G08G 5/04* (2013.01)

(56) References Cited

U.S. PATENT DOCUMENTS

| | | | |
|---|---|---|---|
| 6,700,709 B1* | 3/2004 | Fermann | G02B 27/09 |
| | | | 359/641 |
| 7,592,929 B2 | 9/2009 | Pepitone | |
| 7,974,773 B1 | 7/2011 | Krenz et al. | |
| 8,891,579 B1* | 11/2014 | Price | H01S 5/02292 |
| | | | 372/107 |
| 9,047,771 B1 | 6/2015 | Thoreen et al. | |
| 9,174,746 B1 | 11/2015 | Bell et al. | |
| 9,245,450 B1 | 1/2016 | Chiew et al. | |
| 9,401,094 B2 | 7/2016 | Cros et al. | |
| 9,753,126 B2 | 9/2017 | Smits | |
| 9,941,658 B2 | 4/2018 | Liang et al. | |
| 10,020,639 B2 | 7/2018 | Lell et al. | |
| 10,043,404 B2 | 8/2018 | Ell et al. | |
| 2007/0241936 A1 | 10/2007 | Arthur et al. | |
| 2010/0094487 A1 | 4/2010 | Brinkman | |
| 2012/0057345 A1* | 3/2012 | Kuchibhotla | G02B 27/0961 |
| | | | 362/237 |
| 2014/0092206 A1 | 4/2014 | Boucourt et al. | |
| 2015/0142214 A1 | 5/2015 | Cox et al. | |
| 2016/0274368 A1* | 9/2016 | Gurevich | G02B 27/0961 |
| 2017/0301250 A1 | 10/2017 | Ell et al. | |
| 2017/0334578 A1 | 11/2017 | Fleck et al. | |
| 2017/0357260 A1 | 12/2017 | Gilliland et al. | |
| 2019/0293800 A1* | 9/2019 | Ramthun | G02B 3/06 |
| 2019/0293948 A1* | 9/2019 | Ramthun | B64D 47/02 |

FOREIGN PATENT DOCUMENTS

| | | |
|---|---|---|
| CN | 105391975 A | 3/2016 |
| EP | 0980828 A1 | 2/2000 |
| EP | 1842772 A2 | 10/2007 |
| EP | 1927965 A2 | 6/2008 |
| EP | 2426461 A2 | 3/2012 |
| EP | 2495168 A1 | 9/2012 |
| EP | 2565861 A2 | 3/2013 |
| EP | 2685442 A2 | 1/2014 |
| WO | 2009010969 A2 | 1/2009 |

OTHER PUBLICATIONS

International Civil Aviation Organization, "Airport Markings: ICAO & U.S. Requirements", ICAO: Federal Aviation Administration, dated Jun. 2012, 19 pages.

U.S. Department of Transportation, "Advisory Circular", U.S. DOT: Federal Aviation Administration, dated Sep. 27, 2013, 144 pages.

Xu, Lun Hui et al., "A New Lane Department Warning Algorithm Considering the Driver's Behavior Characteristics", Hindawi Publishing Corporation: Mathematical Problems in Engineering, dated Jul. 26, 2015, 12 pages.

Federal Aviation Administration, "A Quick Reference to Airfield Standards", FAA: Southern Region Airports Division, dated Jan. 2018, 69 pages.

* cited by examiner

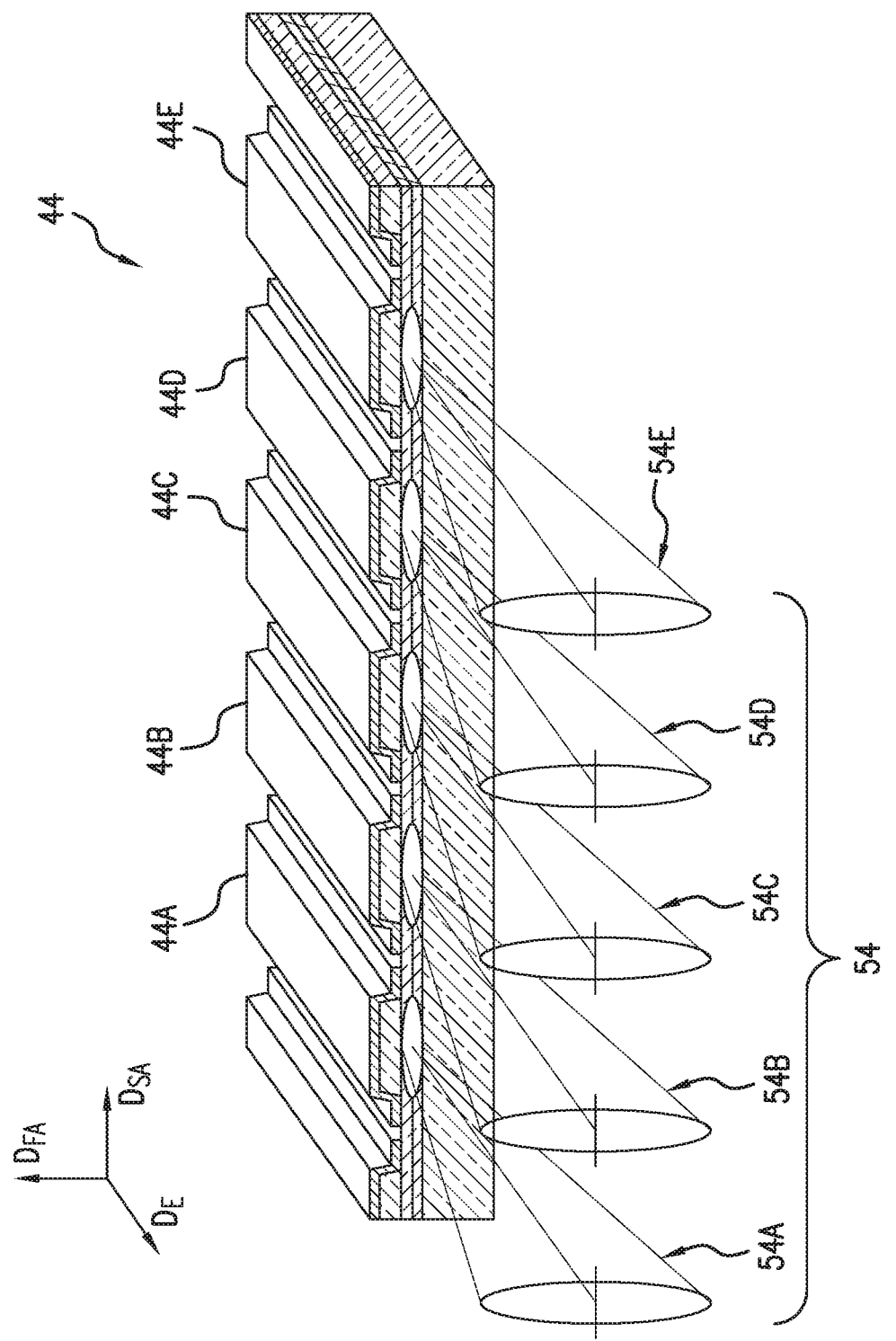

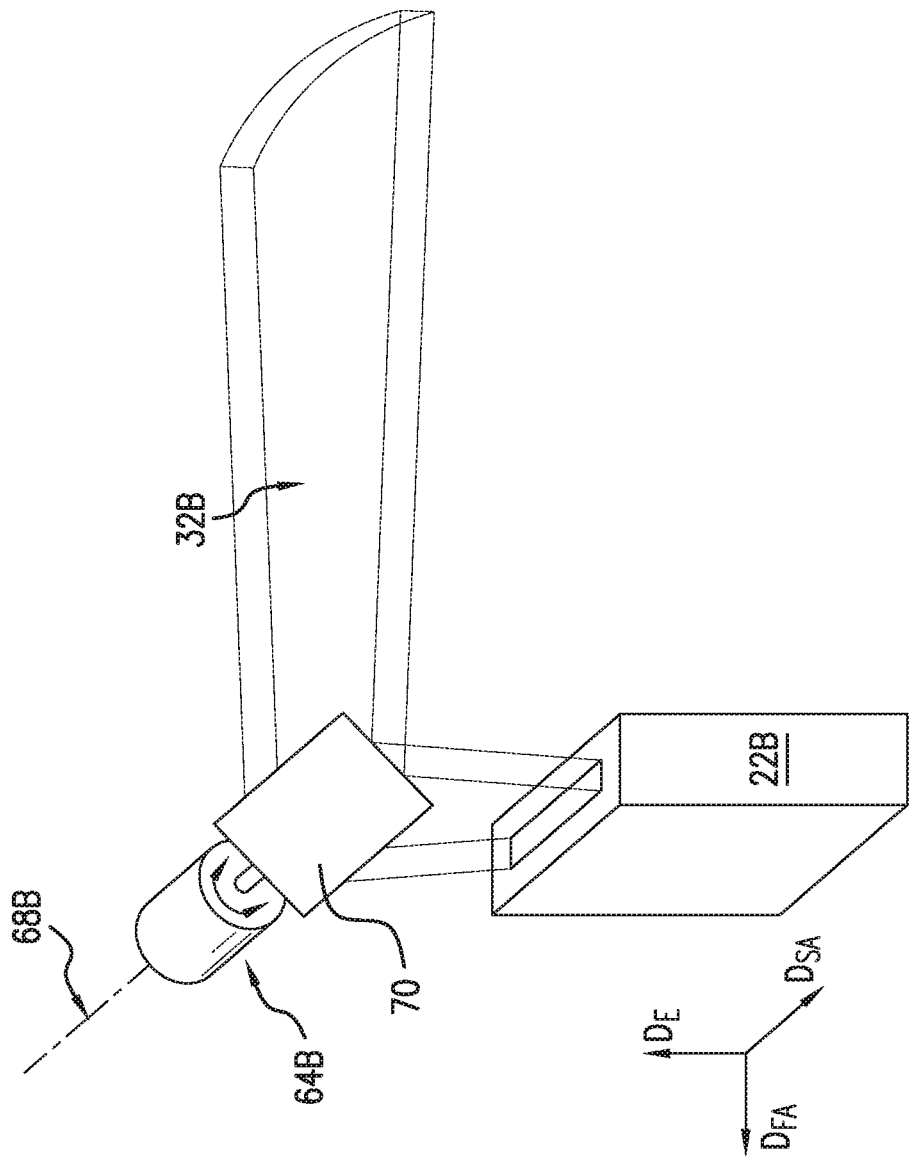

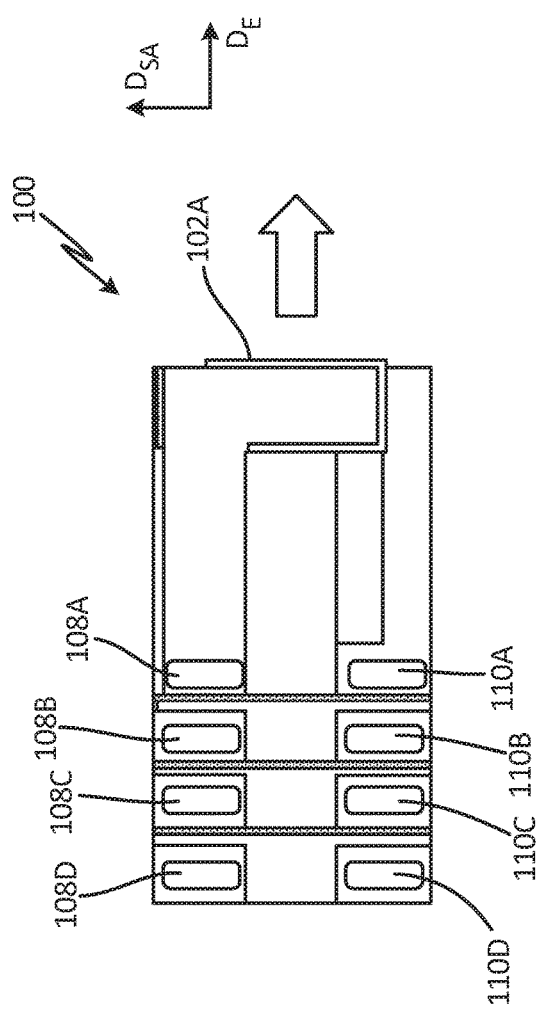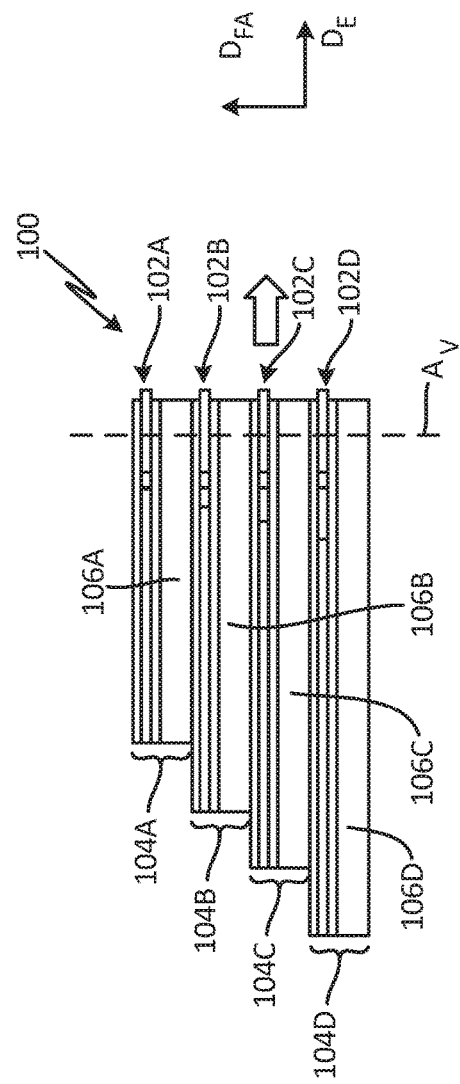

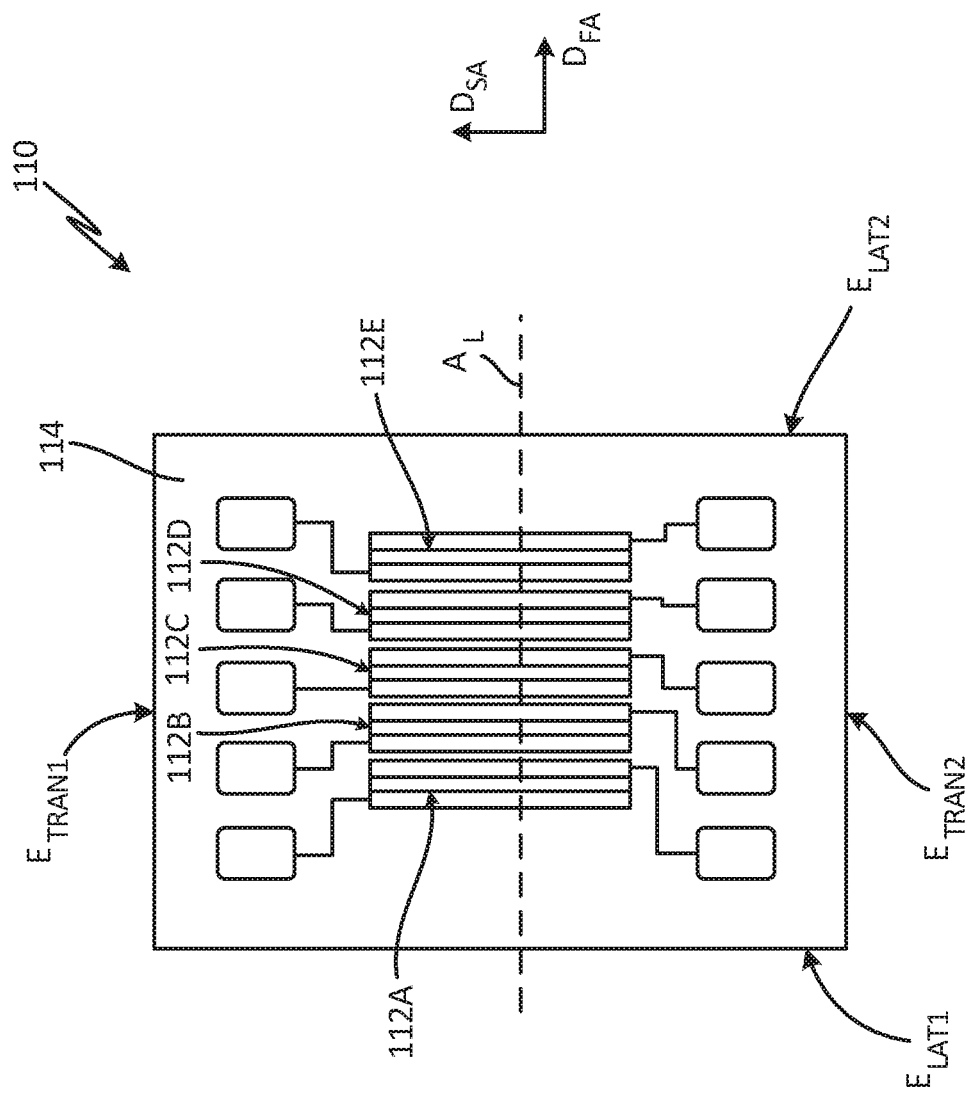
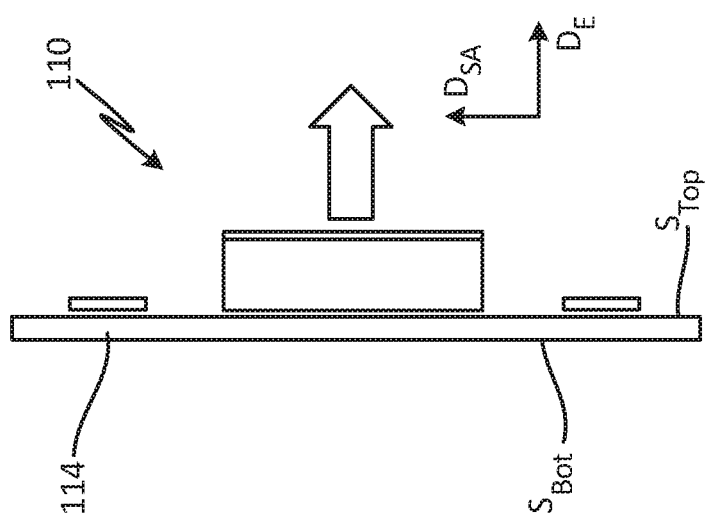
FIG. 9A
FIG. 9B

ARRAY OF INDEPENDENTLY-CONTROLLABLE LASER DIODE BARS FOR SCANNING A LINEAR ILLUMINATION PATTERN

CROSS-REFERENCE TO RELATED APPLICATION(S)

This application is a continuation-in-part of U.S. application Ser. No. 15/936,095 filed Mar. 26, 2018 for "Scanned Linear Illumination of Distant Objects" by K. Ramthun and J. Pesik, which is incorporated herein by reference.

BACKGROUND

Each year, significant time and money are lost due to commercial aircraft accidents and incidents during ground operations, of which significant portions occur during taxiing maneuvers. During ground operations, aircraft share the taxiways with other aircraft, fuel vehicles, baggage carrying trains, mobile stairways and many other objects. Aircrafts often taxi to and/or from fixed buildings and other fixed objects. Should an aircraft collide with any of these objects, the aircraft must be repaired and recertified as capable of operation. The cost of repair and recertification, as well as the lost opportunity costs associated with the aircraft being unavailable for use can be very expensive.

Pilots are located in a central cockpit where they are well positioned to observe objects that are directly in front of the cabin of the aircraft. Objects that are not located directly in front of the cabin, however, can be more difficult to observe. Wings are attached to the cabin behind the cockpit and extend laterally from the cabin in both directions. Some commercial and some military aircraft have large wingspans, and so the wings on these aircraft laterally extend a great distance from the cabin and are thus positioned behind and out of the field of view of the cockpit. Some commercial and some military planes have engines that hang below the wings of the aircraft. Pilots, positioned in the cabin, can have difficulty knowing the risk of collisions between objects external to the aircraft and the wingtips and/or engines.

There are various types of on-ground operations that an aircraft must perform at an airport, each of which present different collision risks to the aircraft. The taxi-in and taxi-out phases require that the aircraft move between the runway and the terminal gates, for example. During taxi-in, the aircraft must first transition from the runway to a taxiway and then to the gateway. Sometimes, the taxiway can include an elaborate network of roads requiring the aircraft to travel over straight stretches as well as turns and transitions to/from the taxiway. Some high-speed taxi operation occurs on one-way taxiways dedicated to aircraft only. During such high-speed taxi operation, relatively distant objects located in the forward direction of the aircraft might present the greatest risk of collision to the aircraft. During low-speed taxiing and gateway approach, nearby objects in the vicinity of the wings and engine nacelles might present the greatest risk of collision to the aircraft.

SUMMARY

Apparatus and associated methods relate to a system for projecting a linear beam of light on a distant object. The system includes an array of independently-controllable laser diode bars distributed along a common axis. Each of the independently-controllable laser diode bars is configured to emit a beam of light in an emission direction orthogonal to the common axis. The emitted beam of light diverges about the emission direction at a first divergence angle in the plane including the emission direction and a fast-axis direction parallel to the common axis. The emitted beam of light diverges about the emission direction at a second divergence angle in the plane including the emission direction and a slow-axis direction. The second divergence angle is less than the first divergence angle.

BRIEF DESCRIPTION OF THE DRAWINGS

FIG. 6 is a perspective view of an embodiment of a bar of laser diodes, which can provide the optical energy for a linear projector configured to focus a linear beam at a predetermined distance.

FIGS. 7A-7C depict linear projectors having various scanning mechanisms.

FIGS. 8A-8B are side-elevation and plan views of an embodiment of an array of independently-controllable laser diode bars, which can be used to scan a linear illumination pattern upon a scene.

FIGS. 9A-9B are side-elevation and plan views of another embodiment of an array of independently-controllable laser diode bars, which can be used to scan a linear illumination pattern upon a scene.

DETAILED DESCRIPTION

Figure 1A:
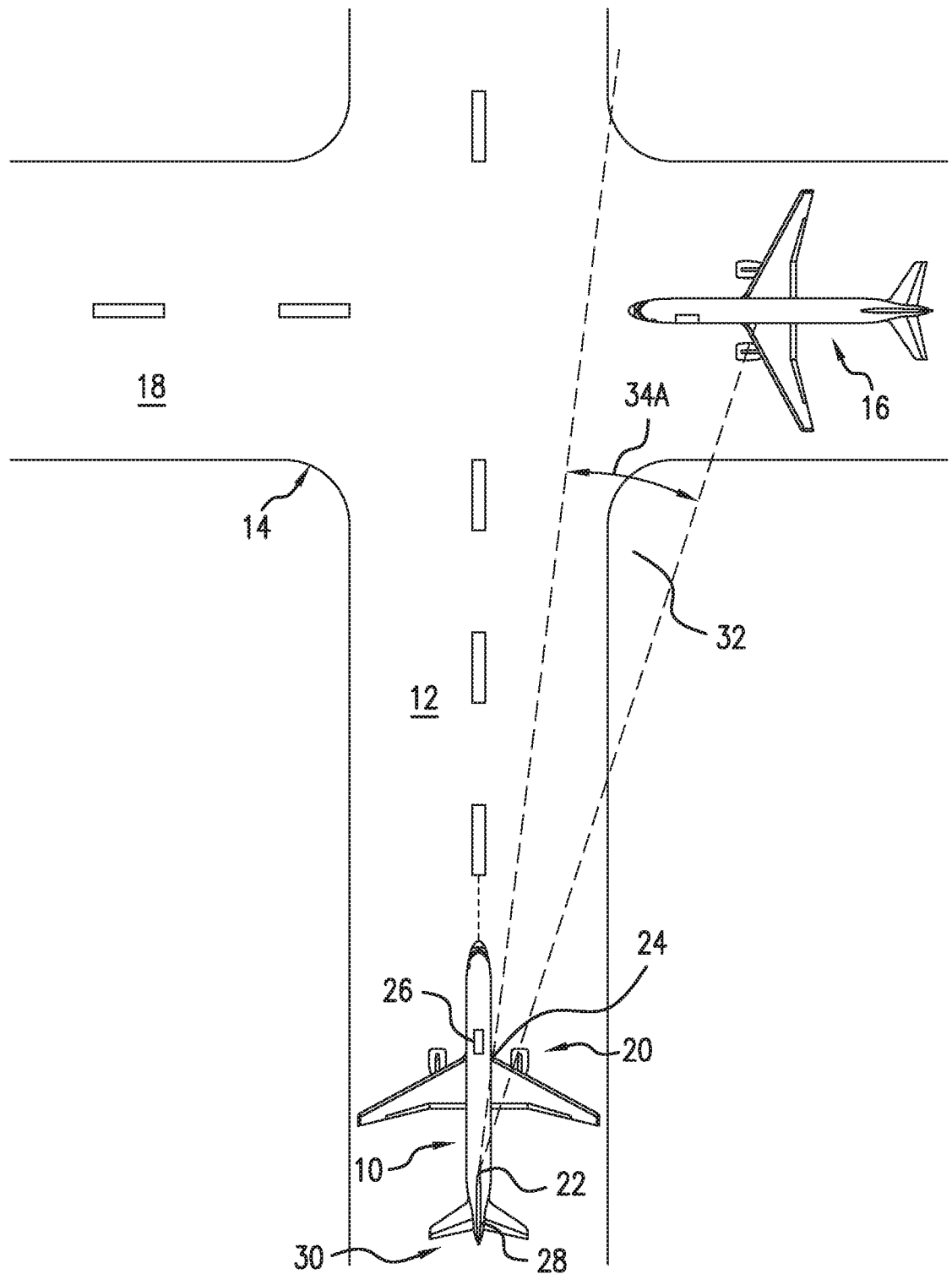
FIG. 1A is a schematic view of an aircraft collision alerting system used by an aircraft on a taxiway.

Apparatus and associated methods relate to projecting a linear beam of light onto a distant object. One or more laser diodes are configured to emit one or more elliptical beams of light in an emission direction. If more than one laser diodes are used, they are aligned so as to have coplanar emission facets and common slow-axis and fast-axis directions, which are perpendicular to one another and to the emission direction. A first cylindrical lens is configured to receive the emitted beam(s) and to collimate each of the emitted beam(s) in the fast-axis direction perpendicular to a slow-axis direction. A second cylindrical lens is configured to receive the emitted beam(s) and to diverge the emitted beam(s) in the slow-axis direction such that if more than one beam is emitted, they are diverged so as to overlap one another in the slow-axis direction.

A linear beam of light is one that has a large ratio of beam dimensions in orthogonal directions transverse to the direction of propagation. For example, if a light projector projects a light beam in a direction parallel with a level ground surface and the light beam has a large azimuthal dimension and a small elevational dimension, such a light beam illuminates a rectangular area of a screen normal to the projection direction. The illuminated rectangular area can be called a horizontal line of illumination if the ratio between the azimuthal dimension and the elevational dimension is much greater than the elevational dimension. For example, if the ratio of the azimuthal dimension to the elevational dimension is greater than 50:1, 100:1, 200:1 or more, then the illuminated are is substantially linear. Similarly, if the light projector projects a light beam in a direction parallel with a level ground surface and the light beam has a small azimuthal dimension and a large elevational dimension, such a light beam again illuminates a rectangular area of a screen normal to the projection direction. But in this scenario, the illuminated rectangular area can be called a vertical line of illumination if the ratio between the elevational dimension and the azimuthal dimension is much greater than the elevational dimension.

Such linear beams of illumination can be used in the determination of distance to the object upon which the linear beams have been projected. For example, if the beam is projected from a first location of an aircraft, and a camera that is mounted at a different location on the aircraft captures images of the illumination pattern, these captured images can contain distance and/or range information regarding the distant objects reflecting the linear beams. The linear beam, for example, may appear broken in the captured images at image locations corresponding to illumination discontinuities—edges of foreground objects. Furthermore, if the projected emitted linear beam is configured so as not to be coplanar with the camera, then triangulation can be used to determine the distances of the objects reflecting the projected linear beam. The locations and/or ranges can be calculated based on a location of a projector, a location of a camera or imager, and the pixel coordinates upon which the reflected linear beam is focused.

The linear beam can be a pulse of light projected in a linear pattern, such as, for example, a pulse having a fixed elevation angle of projection but having an azimuthal angle of projection between +/−25 degrees or more from the nominal direction. In some embodiments, the linear beam can be a collimated beam rastered or scanned in a direction perpendicular to the plane containing the linear beam. The linear beam is projected within a controlled field of view. This means that outside of the controlled field of view, substantially no light energy is projected. Herein the term linear beam indicates that light is projected within the field of view in such a manner that the projected light is not uniformly projected throughout the solid-angle of projection. For example, light will be primarily projected along certain azimuthal and/or elevational angles comprising a subset of the azimuthal and elevational angles within the solid-angle of light projection. Other subsets of the solid-angle of light projection can be used for linear beam projection.

In some embodiments, the linear beam can have a wavelength corresponding to infrared light and/or to an atmospheric absorption band. Using infrared light, because it is outside the visible spectrum, can minimize a distraction to a pilot who is taxiing the aircraft. Using infrared light that has a wavelength within an atmospheric absorption band can permit low-power projector illumination, as the illuminating power need not compete with the sun's illumination in such an absorption band. Knowing a first location on an aircraft from which the light is projected, a second location on an aircraft from which the reflection is imaged, and a pixel coordinate within the image corresponding to an object from which the light is reflected permits a calculation of the location and/or range of that reflecting object.

FIG. 1A is a schematic view of an exemplary aircraft collision alerting system used by an aircraft on a taxiway. In FIG. 1A, first aircraft 10 is taxiing along one-way taxiway 12. First aircraft 10 is approaching taxiway crossing 14. Second aircraft 16 is near the taxiway crossing 14 on taxiway 18. First aircraft 10 is equipped with aircraft collision alerting system 20. Aircraft collision alerting system 20 includes linear projector 22, camera 24, and a controller 26. In the depicted embodiment, linear projector 22 is mounted on vertical stabilizer 28 of tail 30. Linear projector 22 is configured to project linear beam 32 onto a scene external to first aircraft 10, thereby illuminating objects external to first aircraft 10. Linear projector 22 can be mounted at other locations on first aircraft 10 in other embodiments. Controller 26 controls and/or scans the direction of projection, such that linear projector 22 projects linear beam 32 within a controlled direction of projection. In the depicted embodiment, the direction of projection spans various elevation angles of projection 34A.

The directions of projection can be orthogonal to the angular direction of the linear beam 32. For example, if linear beam 32 is in a plane that is roughly parallel to a ground surface (e.g., projecting horizontal lines on distant objects), then controller 26 can be configured to scan linear beam 32 in an elevational manner. Conversely, if linear beam 32 is in a plane that is perpendicular to a ground surface (e.g., projecting vertical lines on distant objects), then controller 26 can be configured to scan linear beam 32 in an azimuthal manner. By focusing linear beam 32 so as to form lines of illumination on distant objects, the power required for projecting linear beam 32 can be reduced.

Figure 1B:
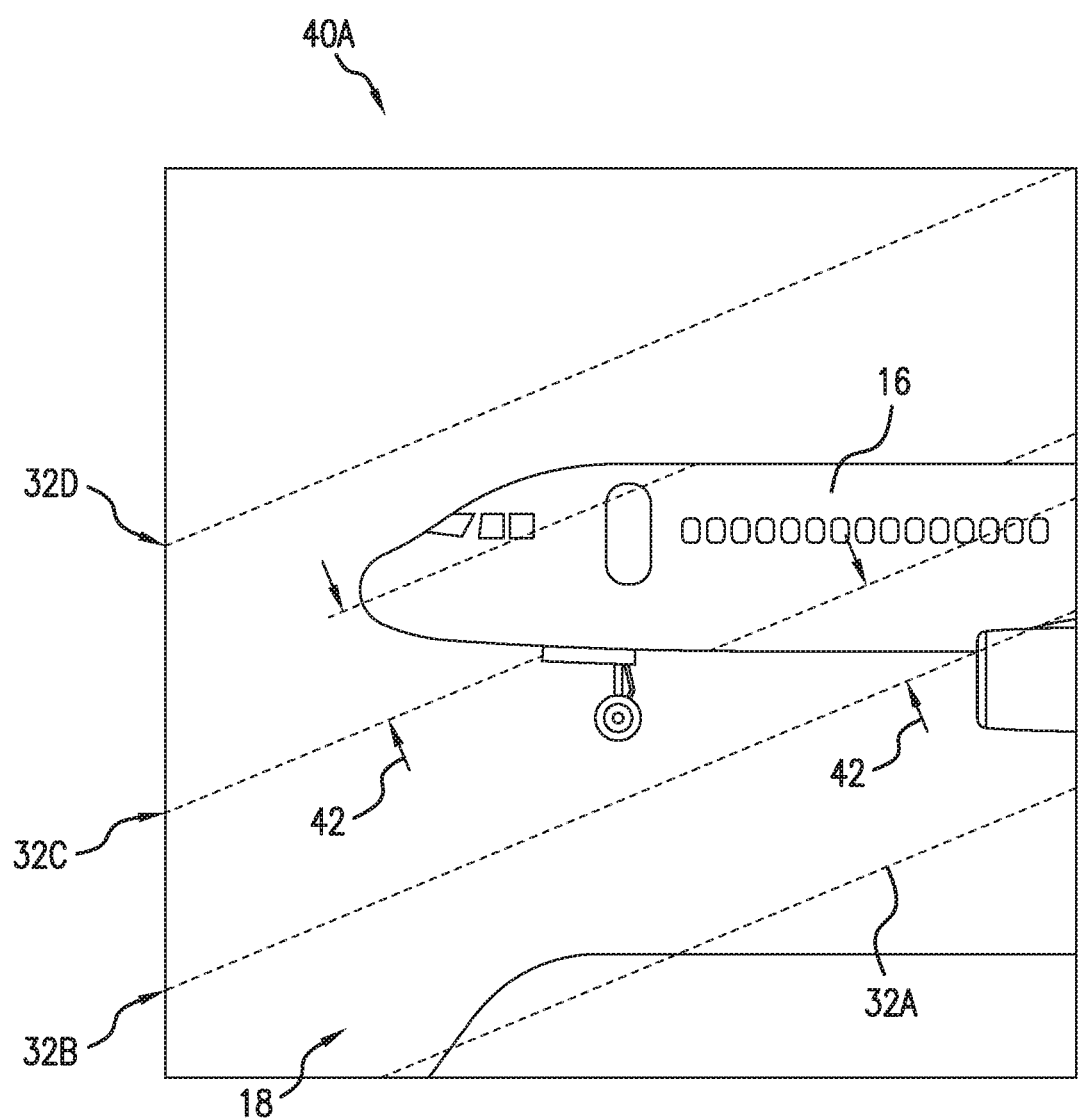
FIG. 1B depicts an image captured by a camera of the collision alerting system mounted to the aircraft depicted in FIG. 1A.

FIG. 1B depicts an image captured by a camera of the collision alerting system mounted to the aircraft depicted in FIG. 1A. In FIG. 1B, captured image 40A has a field of view commensurate with the solid-angle of projection of linear beam 32. Captured image 40A depicts second aircraft 16 on taxiway 18. Superimposed on taxiway 18 and second aircraft 16 are lines 32A-32D generated by linear projector 22. Because linear projector 22 and camera 24 are mounted to first aircraft 10 at different locations, lines 32A-32D will have discontinuities 42 in captured image 40A where linear beam 32 encounters objects, such as second aircraft 16. Such discontinuities 42 in captured image 40A are indicative of differences in the locations and/or ranges of the objects from which linear beam 32 reflects.

Such aircraft collision alerting systems as described with reference to FIGS. 1A-1B have been disclosed by Rutkiewicz et al., in U.S. patent application Ser. No. 15/489,381, titled "Method and System for Aircraft Strike Alerting, filed Apr. 17, 2017, the entire specification of which is hereby incorporated by reference.

Figure 2:
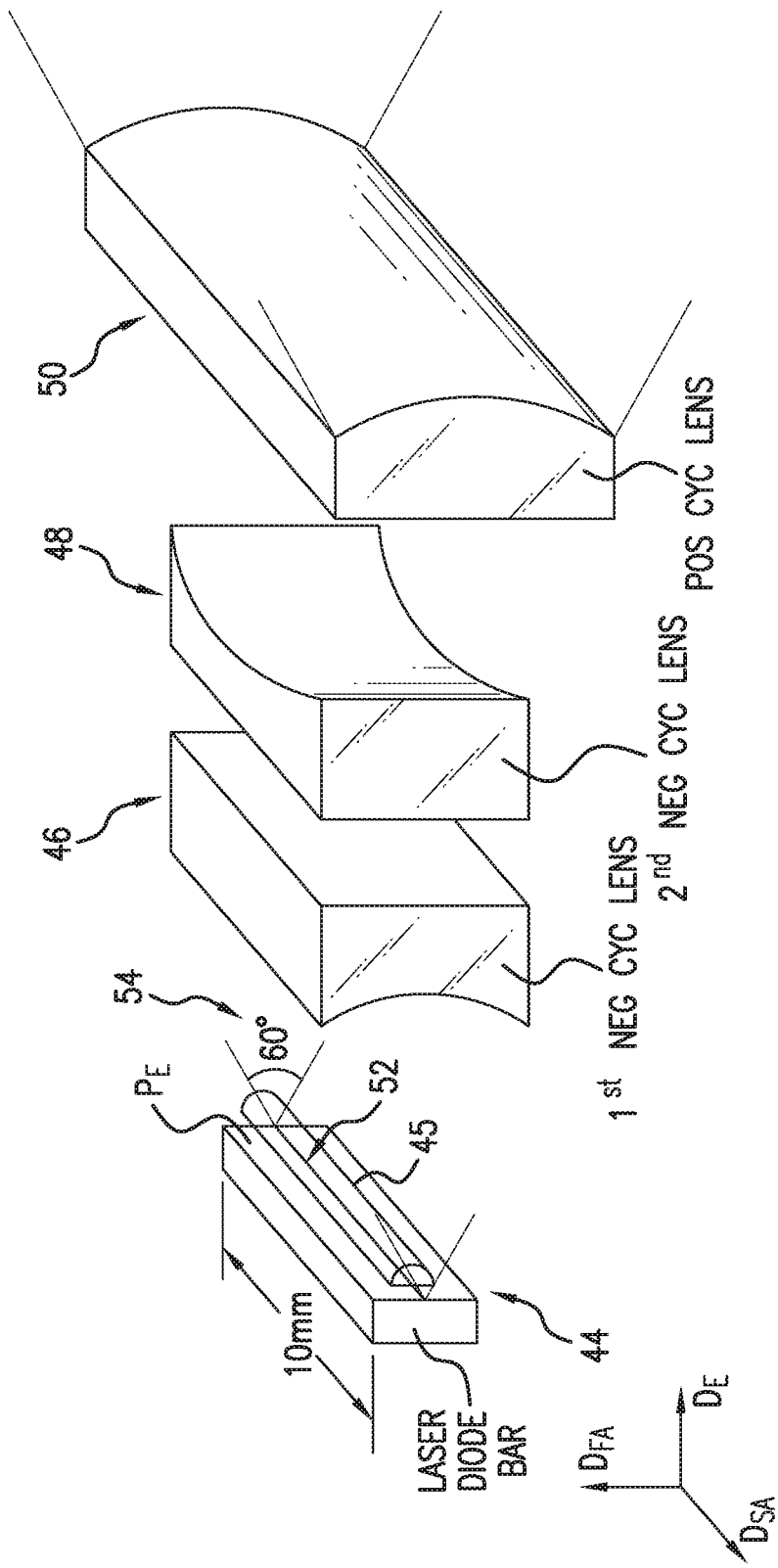
FIG. 2 is a perspective view of an embodiment of a linear projector configured to focus a linear beam at a predetermined distance.

FIG. 2 is a perspective view of an embodiment of a linear projector configured to focus a linear beam at a predetermined distance. In FIG. 2, linear projector 22 includes laser diode bar 44, first convex cylindrical lens 45, first concave cylindrical lens 46, second concave cylindrical lens 48, and second convex cylindrical lens 50. Laser diode bar 44 includes a plurality of laser diodes all aligned so as to each emit a beam in emission direction $D_E$ normal to emission plane $P_E$, which is coplanar with emission facets of each of the plurality of laser diodes of laser diode bar 44. Each of the laser diodes has both a fast-axis direction $D_{FA}$ and a slow-axis direction $D_{SA}$ that are approximately the same as the fast-axis direction $D_{FA}$ and slow-axis direction $D_{SA}$, respectively, pertaining to each of the other of the plurality laser diodes of laser diode bar 44. Various embodiments can use more or fewer laser diodes, including one embodiment in which a single laser diode can be used to emit an optical beam. Fast-axis direction $D_{FA}$, slow-axis direction $D_{SA}$, and emission direction $D_E$ are all orthogonal one to another, in the depicted embodiment.

Simultaneous pulses of optical energy are emitted by each of the plurality of laser diodes of laser diode bar 44. The simultaneously emitted pulses of optical energy are emitted from emission facets located along transverse axis 52 within emission plane $P_E$. The simultaneously emitted pulses of optical energy form linear emission beam 54 having divergence in both slow-axis direction $D_{SA}$ and fast-axis direction $D_{FA}$. Divergences in the slow-axis direction are divergences about the emission direction in the plane including the emission direction and the slow-axis direction. Divergences in the fast-axis direction are divergences about the emission direction in the plane including the emission direction and the fast-axis direction. In the FIG. 2 depiction, linear emission beam 54 is shown as having a 60° angle of divergence as measured before lens correction.

Linear emission beam 54 is then received by first convex cylindrical lens 45. First convex cylindrical lens 45 is convex in a fast-axis direction $D_{FA}$ and planar in a slow-axis direction $D_{SA}$. Such a lens can be called a plano-convex cylindrical lens. Because the convexity of first convex cylindrical lens 45 is aligned with fast-axis direction $D_{FA}$, first convex cylindrical lens 45 is configured to refract linear emission beam 54 so as to change the divergence of linear emission beam 54 in the fast-axis direction. For plano-convex cylindrical lenses, the beam divergence is decreased by refraction. Thus, first convex cylindrical lens 45 decreases the divergence of received linear emission beam 54 in the fast-axis direction. In some embodiments, first convex cylindrical lens 45 is mounted directly onto laser diode bar 44. Some embodiments do not have first convex cylindrical lens 45.

First concave cylindrical lens 46 is configured to receive linear emission beam 54 after it is refracted by first convex cylindrical lens 45. First concave cylindrical lens 46 is concave in fast-axis direction $D_{FA}$ and planar in slow-axis direction $D_{SA}$. Such a lens can be called a plano-concave cylindrical lens. Because the concavity of first concave cylindrical lens 46 is aligned with fast-axis direction $D_{FA}$, first concave cylindrical lens 46 is configured to refract linear emission beam 54 so as to change the divergence of linear emission beam 54 in the fast-axis direction. For plano-concave cylindrical lenses, the beam divergence is increased by refraction. Thus, first concave cylindrical lens 46 increases the divergence of received linear emission beam 54 in the fast-axis direction. In some embodiments, the first lens can be a cylindrical lens such as the plano-concave cylindrical lens depicted in FIG. 2. In other embodiments, the first lens can be a spherical or an aspherical lens.

Second concave cylindrical lens 48 is configured to receive linear emission beam 54 after it is refracted by first concave cylindrical lens 46. The depicted location of second concave cylindrical lens 48 follows first concave cylindrical lens 46, but in other embodiments second concave cylindrical lens can precede first concave cylindrical lens 46. Second concave cylindrical lens 48 is concave in the slow-axis direction $D_{SA}$ and planar in the fast-axis direction $D_{FA}$. Because the concavity of second concave cylindrical lens 48 is aligned with slow-axis direction $D_{SA}$, second concave cylindrical lens 48 is configured to refract linear emission beam 54 so as to change the divergence about the emission direction in the plane including the emission direction and a slow-axis direction. In the depicted embodiment, second concave cylindrical lens 48 increases the divergence of linear emission beam 54 in the slow-axis direction. By orienting the concavity of second concave cylindrical lens 48 in the slow-axis direction, which is the direction in which the plurality of laser diodes of laser diode bar 44 are aligned, the pulses of optical energy emitted by the individual laser diodes of laser diode bar 44 will overlap the optical energy emitted by neighboring laser diodes of laser diode bar 44. Such overlap can result in a 100% fill factor in the projected linear beam of light. In some embodiments, the divergence will not result in 100% fill factor yielding a dashed linear beam of light or a linear beam having periodic intensity variation.

Second convex cylindrical lens 50 is configured to receive linear emission beam 54 after it is refracted by second concave cylindrical lens 48. Second convex cylindrical lens 50 is convex in the fast-axis direction $D_{FA}$ and planar in the slow-axis direction $D_{SA}$. Such a lens can be called a plano-convex cylindrical lens. Because the convexity of second convex cylindrical lens 50 is aligned with fast-axis direction $D_{FA}$, second convex cylindrical lens 50 is configured to refract linear emission beam 54 so as to change the divergence about the emission direction in the plane including the emission direction and a fast-axis direction. For plano-convex cylindrical lenses, the beam divergence is decreased by refraction. Thus, second convex cylindrical lens 50 decreases the divergence of received linear emission beam 54 in the fast-axis direction. Although the FIG. 2 embodiment depicts plano-convex and plano-concave cylindrical lenses, various embodiments can use other types of convex and concave cylindrical lenses.

In some embodiments, the combination of first convex cylindrical lens 45, first concave cylindrical lens 46 and second convex cylindrical lens 50 are configured to collimate and/or focus linear emission beam 54 in the fast-axis direction. In some embodiments more or fewer cylindrical lenses can be configured to collimate and/or focus linear emission beam 54 in the fast-axis direction. In other embodiments, first convex cylindrical lens 45, first concave cylindrical lens 46 and second convex cylindrical lens 50 are configured to focus linear emission beam 54 in the fast-axis direction so that at a predetermined distance from linear projector 22, linear emission beam 54 has small full-width half-magnitude (FWHM) width in the fast-axis direction and large FWHM length in the slow-axis direction, thereby earning its name of "linear emission beam." In some embodiments, such a narrow beam in the fast-axis direction can have a FWHM width of less than 10 centimeters, 5 centimeters, 3 centimeters, or 2 centimeter in the fast-axis width. At the predetermined distance at which linear emission beam 54 is focused, linear emission beam 54 can have a large slow-axis length. For practical purposes the length of the beam can be considered to be very long in the slow-axis direction, having a length to width ratio exceeding 100:1, 1000:1, or 10,000:1 at a distance from emission where the beam is focused, so as not to impose a slow-axis barrier to passage of the linear emission beam 54.

For example, in one embodiment, linear projector 22 can be configured to focus linear emission beam 54 in the fast-axis direction $D_{FA}$ at a predetermined distance of 150 meters while diverging linear emission beam 54 at 50° in the slow-axis direction $D_{SA}$. At the predetermined distance, the FWHM of linear emission beam 54 can be less than 1.5 centimeters in the fast-axis direction $D_{FA}$ and can be about 140 meters in the slow-axis direction $D_{SA}$. The predetermined distance at which a ratio of the length to width of the beam can vary in accordance with beam illumination specifications. For example, the beam may be focused and diverged in such a manner as to cause a FWHM length to width ratio to exceed 50:1, 100:1, 500:1 or 1000:1 at a distance of 50, 80, 100, 120, 200, or 300 meters from linear projector 22, for example.

Because detection of linear emission beam 54 can be used to determine range and/or location information of objects from which the beam reflects, linear emission beam 54 should be detectable by a detector. To ensure that linear emission beam 54 is detectable, linear emission beam 54 should have intensity greater than the solar irradiance level present during daylight conditions. The solar irradiance can be as high as 100,000 lux or 1 kilowatt per square meter on bright sunny days. Focusing linear emission beam 54 in such a linear fashion as described above can provide local intensities of linear emission beam 54 that are in excess of the solar irradiance, at least for a portion of the solar spectrum that includes the emission spectrum of linear emission beam 54. Filtering the detection spectrum to include only the emission spectrum and a guard band on either side of the emission spectrum further improves detectability of linear emission beam 54.

In some embodiments, linear emission beam 54 is in the infrared band of the optical spectrum. Such an emission spectrum can be used to illuminate distant objects while remaining undetectable to humans so as not to distract pilots and ground crew. In some embodiments, linear emission beam 54 can have a spectral bandwidth as small as 2.5 nm.

Figure 3:
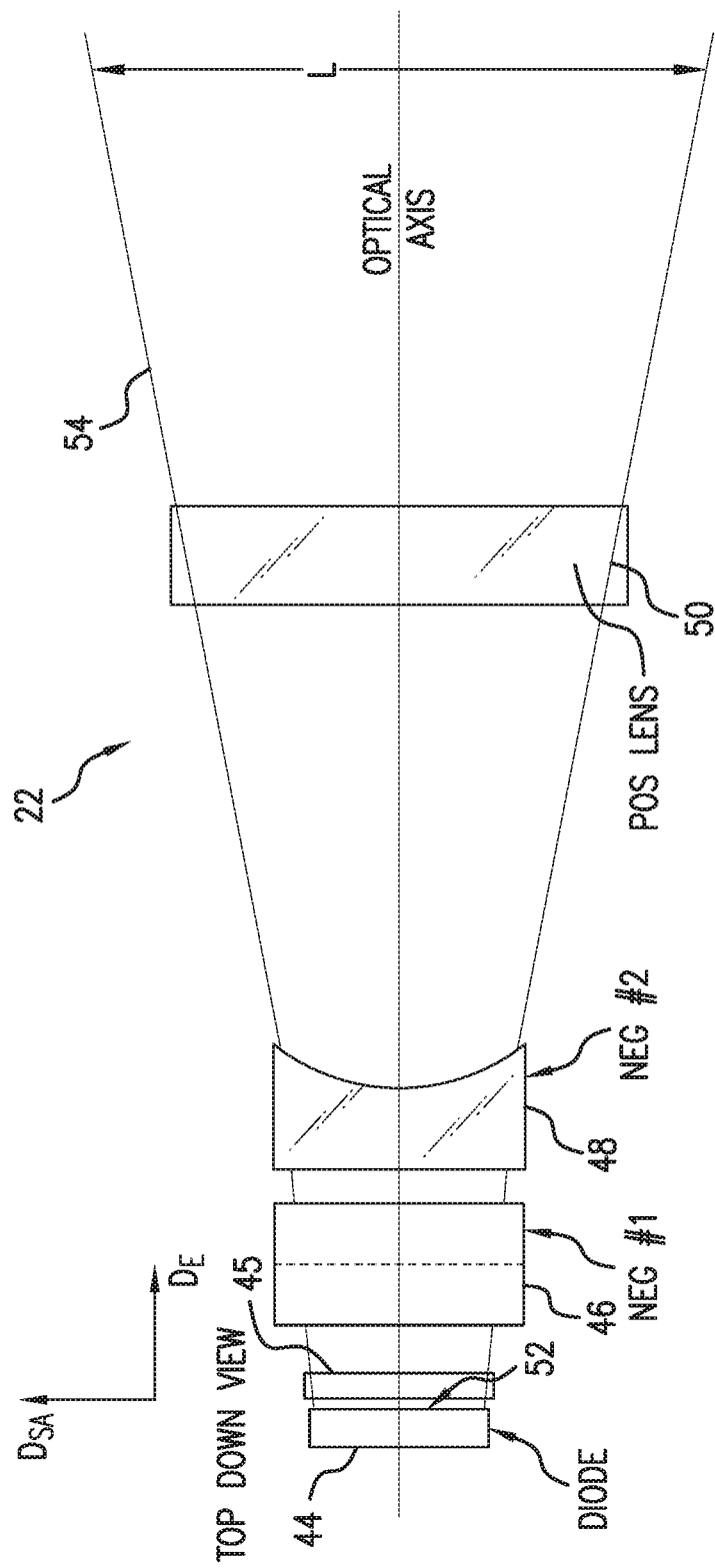
FIG. 3 is a plan view of the linear projector depicted in FIG. 2.

FIG. 3 is a plan view of the linear projector depicted in FIG. 2. The plan view orientation of FIG. 3 is helpful in depicting the operation of linear projector 22 in the slow-axis direction $D_{SA}$. In FIG. 3, linear projector 22 includes laser diode bar 44, first convex cylindrical lens 45, first concave cylindrical lens 46, second concave cylindrical lens 48, and second convex cylindrical lens 50. Laser diode bar 44 includes a plurality of laser diodes all aligned so as to each emit a beam in emission direction $D_E$. The plurality of laser diodes of laser diode bar 44 generates simultaneous pulses of optical energy from each of the plurality of laser diodes so as to emit laser beams from emission facets located along transverse axis 52. In the FIG. 3 plan view, only divergence in the slow-axis direction $D_{SA}$ (i.e., about the emission direction in the plane including the emission direction and a fast-axis direction) of linear emission beam 54 can be depicted. The FWHM length L in the slow-axis direction increases with increasing distance from linear projector 22 due to the positive beam divergence in the slow-axis direction.

Linear emission beam 54 is received by first convex cylindrical lens 45. First convex cylindrical lens 45 is planar in slow-axis direction $D_{SA}$. Because of the planarity of first convex cylindrical lens 45 in the slow-axis direction $D_{SA}$, first convex cylindrical lens 45 doesn't significantly change the divergence of linear emission beam 54 in the slow-axis direction $D_{SA}$.

First concave cylindrical lens 46 is configured to receive linear emission beam 54 after it is refracted by first convex cylindrical lens 45. First concave cylindrical lens 46 is planar in slow-axis direction $D_{SA}$. Because of the planarity of first concave cylindrical lens 46 in the slow-axis direction $D_{SA}$, first concave cylindrical lens 46 doesn't significantly change the divergence in of linear emission beam 54 in the slow-axis direction $D_{SA}$.

Second concave cylindrical lens 48 is configured to receive linear emission beam 54 after it is refracted by first concave cylindrical lens 46. Second concave cylindrical lens 48 is concave in the slow-axis direction $D_{SA}$. Because the concavity of second concave cylindrical lens 48 is aligned with slow-axis direction $D_{SA}$, second concave cylindrical lens 48 is configured to refract linear emission beam 54 so as to change the divergence in the slow-axis direction. In the depicted embodiment, second concave cylindrical lens 48 increases the divergence of linear emission beam 54 in the slow-axis direction. By orienting the concavity of second concave cylindrical lens 48 in the slow-axis direction, which is the direction in which the plurality of laser diodes of laser diode bar 44 are aligned, the pulses of optical energy emitted by the individual laser diodes of laser diode bar 44 will overlap the optical energy emitted by neighboring laser diodes of laser diode bar 44.

Second convex cylindrical lens 50 is configured to receive linear emission beam 54 after it is refracted by second concave cylindrical lens 48. Second convex cylindrical lens 50 is planar in the slow-axis direction $D_{SA}$. Because of the planarity of second convex cylindrical lens 50 in the slow-axis direction $D_{SA}$, second convex cylindrical lens 50 doesn't significantly change the divergence in of linear emission beam 54 in the slow-axis direction $D_{SA}$.

Figure 4:
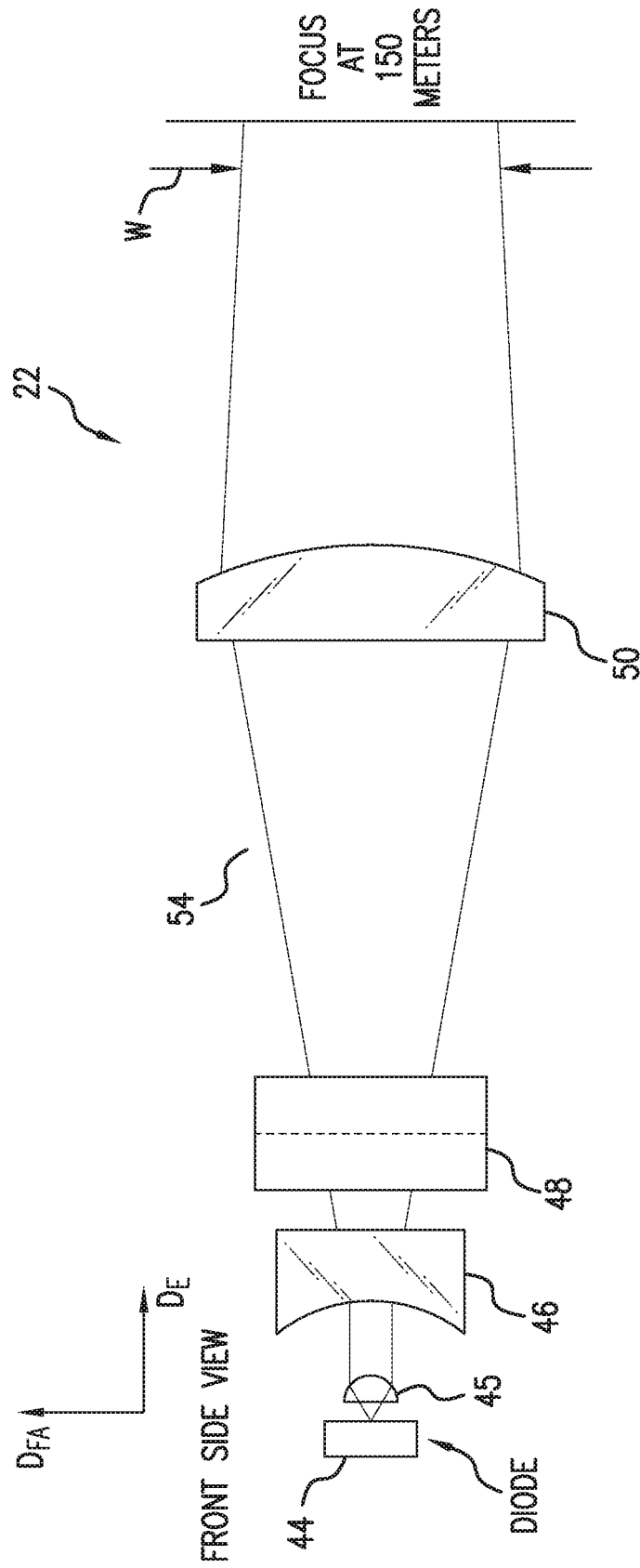
FIG. 4 is a side-elevation view of the linear projector depicted in FIGS. 2 and 3.

FIG. 4 is a side-elevation view of the linear projector depicted in FIGS. 2 and 3. The side-elevation view orientation of FIG. 4 is helpful in depicting the operation of linear projector 22 in the fast-axis direction $D_{FA}$. In FIG. 4, linear projector 22 includes laser diode bar 44, first convex cylindrical lens 45, first concave cylindrical lens 46, second concave cylindrical lens 48, and second convex cylindrical lens 50. Laser diode bar 44 includes a plurality of laser diodes all aligned so that, from the side-elevation perspective, the beam is emitted from a point and in emission direction $D_E$. In the FIG. 4 side-elevation view, only divergence in the fast-axis direction $D_{FA}$ (i.e., about the emission direction in the plane including the emission direction and a fast-axis direction) of linear emission beam 54 can be depicted. The FWHM width W in the fast-axis direction doesn't significantly increase with distance from linear projector 22 due to the non-positive beam divergence in the fast-axis direction. For collimated beams, the angle of divergence in the fast-axis direction is approximately zero (e.g., between +/−a few degrees), and for focused beams, the angle of divergence in the fast-axis direction is negative. Thus, the beam narrows with increasing distance until a projection distance approximately equal to a focal point of the optical system. Beyond such a focal point, the beam width W increases having a divergence angle therefrom approximately opposite (i.e., additive inverse) the angle of divergence as measured at the focusing lens.

Linear emission beam 54 is received by first convex cylindrical lens 45. First convex cylindrical lens 45 is convex in a fast-axis direction $D_{FA}$. Because the convexity of first convex cylindrical lens 45 is aligned with fast-axis direction $D_{FA}$, first convex cylindrical lens 45 is configured to refract linear emission beam 54 so as to change the divergence of linear emission beam 54 in the fast-axis direction $D_{FA}$. For such a convex lens configuration, the beam divergence is decreased by refraction. Thus, first convex cylindrical lens 45 decreases the divergence of received linear emission beam 54 in the fast-axis direction. First convex cylindrical lens can be used in conjunction with first concave cylindrical lens 46 and/or second convex cylindrical lens 50 to collimate and/or focus linear emission beam 54 in a fast-axis direction, as will be described below.

First concave cylindrical lens 46 is configured to receive linear emission beam 54 after it is refracted by first convex cylindrical lens 45. First concave cylindrical lens 46 is concave in fast-axis direction $D_{FA}$. Because the concavity of first concave cylindrical lens 46 is aligned with fast-axis direction $D_{FA}$, first concave cylindrical lens 46 is configured to refract linear emission beam 54 so as to change the divergence of linear emission beam 54 in the fast-axis direction $D_{FA}$. For such a concave lens configuration, the beam divergence is increased by refraction. Thus, first concave cylindrical lens 46 increases the divergence of received linear emission beam 54 in the fast-axis direction.

Second concave cylindrical lens 48 is configured to receive linear emission beam 54 after it is refracted by first concave cylindrical lens 46. Second concave cylindrical lens 48 is planar in the fast-axis direction $D_{FA}$. Because the planarity of second concave cylindrical lens 48 in the fast-axis direction $D_{FA}$, second concave cylindrical lens 48 doesn't significantly change the divergence in of linear emission beam 54 in the fast-axis direction $D_{FA}$.

Second convex cylindrical lens 50 is configured to receive linear emission beam 54 after it is refracted by first concave cylindrical lens 46. Second convex cylindrical lens 50 is convex in the fast-axis direction $D_{FA}$. Because the convexity of second convex cylindrical lens 50 is aligned with fast-axis direction $D_{FA}$, second convex cylindrical lens 50 is configured to refract linear emission beam 54 so as to change the divergence of linear emission beam 54 in the fast-axis direction $D_{FA}$. For such a convex lens configuration, the beam divergence is decreased by refraction. Thus, second convex cylindrical lens 50 decreases the divergence of received linear emission beam 54 in the fast-axis direction.

In some embodiments, the combination of first concave cylindrical lens 46 and second convex cylindrical lens 50 are configured to collimate and/or focus linear emission beam 54 in the fast-axis direction. In other embodiments, first concave cylindrical lens 46 and second convex cylindrical lens 50 are configured to focus linear emission beam 54 in the fast-axis direction so that at a predetermined distance from linear projector 22, linear emission beam 54 has a small width in the fast-axis direction. For example, the full-width half-magnitude (FWHM) width of the optical energy can be equal to or less than 5 centimeters, 3 centimeters, or 2 centimeter in the fast-axis direction. At the predetermined distance at which linear emission beam 54 is focused, linear emission beam 54 can have a large slow-axis direction.

Figure 5:
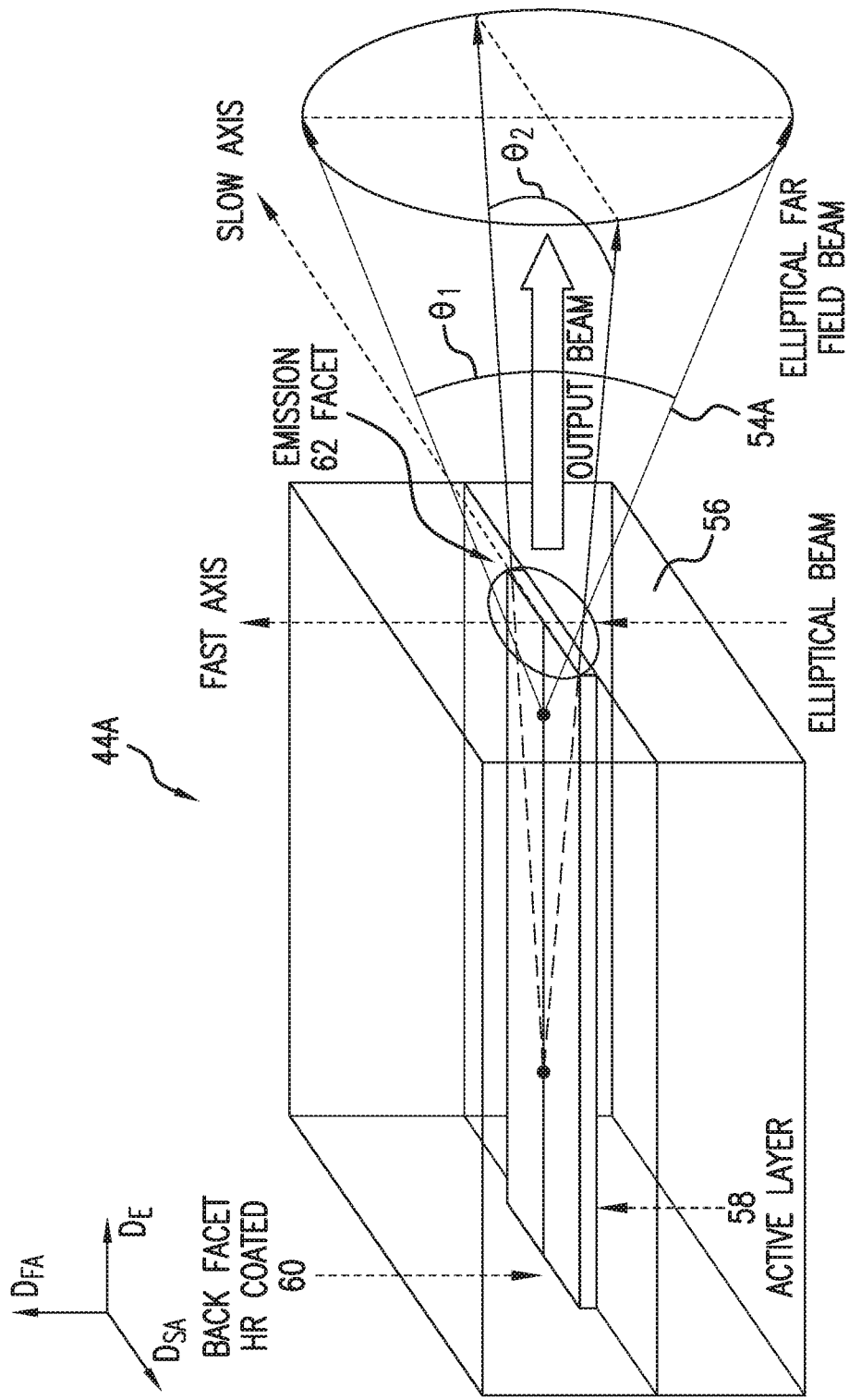
FIG. 5 is a schematic diagram of a single laser diode and a projected beam annotated with various beam characteristics.

FIG. 5 is a schematic diagram of a single laser diode and a projected beam annotated with various beam characteristics. In FIG. 5, laser diode 44A is one of the plurality of laser diodes of laser diode bar 44 depicted in FIGS. 2-4. Laser diode 44A includes semiconductor portion 56 in which is formed active layer 58. Back facet 60 and emission facet 62 are formed on opposite sides of active layer 58. Back facet 60 can be coated with a coating that causes near-total internal reflection of optical energy. Laser diode 44A is shown emitting pulse of optical energy 54A in emission direction DE normal to emission facet 62.

Pulse of optical energy 54A is elliptical, astigmatic, and has large divergence. Pulse of optical energy 54A is generated in active layer 58 of semiconductor portion 56 and is emitted from emission facet 62 at one end of the active layer 58. Because active layer 58 of laser diode 44A has a rectangular shaped cross section—thin in the fast-axis direction $D_{FA}$ and wide in the slow-axis direction—$D_{SA}$ emitted pulse of optical energy 54A at emission facet 62 has an elliptical shape as depicted. For example, in the depicted embodiment, pulse of optical energy 54A emitted at emission facet 62 is about five microns in the direction vertical to active layer 58 (the fast-axis direction $D_{FA}$) and hundreds of microns in the direction horizontal to active layer 58 (the slow-axis direction $D_{SA}$).

Various embodiments use various sources of light emissions. For example, various types, geometries of laser diodes can be used to generate a linear beam of light using the lens configurations described herein. Embodiments in which the laser diodes have different dimensions, the ratio of the slow-axis beam length to the fast-axis beam width can be as large as 50:1, 100:1 or even greater. Furthermore, non-laser-diode light sources, such as traditional lasers or vertical-cavity surface emission lasers can also be used to generate a linear beam of light using the lens configurations described herein.

The beam divergence, however, is greater in the fast-axis direction $D_{FA}$ (i.e., about the emission direction in the plane including the emission direction and the fast-axis direction) than in the slow-axis direction $D_{SA}$ (i.e., about the emission direction in the plane including the emission direction and the slow-axis direction). This is indicated by the first divergence angle $\theta_1$ (i.e., the divergence in the fast-axis direction) being greater than the second divergence angle $\theta_2$ (i.e., the divergence in the slow-axis direction). Thus, as pulse of optical energy 54A propagates away from emission facet 62, the ratio of the slow-axis beam length to the fast-axis beam width will continuously decrease. For example, the full width half magnitude (FWHM) divergent angle in the slow-axis direction $D_{SA}$ can be between 6°-12°, while the FWHM divergent angle in the fast-axis direction $D_{FA}$ can be between 15°-40°.

FIG. 6 is a perspective view of an embodiment of a bar of laser diodes, which can provide the optical energy for a linear projector configured to focus a linear beam at a predetermined distance. In FIG. 6, laser diode bar 44 includes laser diodes 44A-44E. Laser diodes 44A-44E generate beams of optical energy 54A-54E, respectively. Each of the generated pulses of optical energy 54A-54E is emitted in emission direction $D_E$. As each of the emitted pulses of optical energy propagates, divergence in both the slow-axis direction $D_{SA}$ and in the fast-axis direction $D_{FA}$ occurs. Because divergence in the fast-axis direction $D_{FA}$ is greater than divergence in the slow-axis direction $D_{SA}$, the far-field elliptical profile of the pulses are different than the profile of the pulses at the emission facets.

Laser diodes 44A-44E are aligned along a transverse axis that is parallel to the slow-axis direction. Although the divergence angle in the slow-axis direction $D_{SA}$ is small (e.g., less than 20° is not uncommon), optical pulses of energy 54A-54E will eventually combine to form a single linear emission beam 54, even without lensing. Combined beam 54, however, will only have a divergence in the slow-axis direction $D_{SA}$ equal to the divergence in the slow-axis direction $D_{SA}$ of each of the optical pulses of energy 54A-54E. To increase the divergence in the slow-axis direction a concave cylindrical lens can be used, as shown above by second concave cylindrical lens 48, depicted in FIG. 2. For even greater divergences, cylindrical lens 48 can be a combination of two or more concave cylindrical lenses. Such lens configurations can provide slow-axis divergence up to 180 degrees.

Combined beam 54 has a greater divergence in the fast-axis direction $D_{FA}$ than in the slow-axis direction $D_{SA}$. A plano-convex lens, such as second convex cylindrical lens 50 depicted in FIG. 2, can be used to collimate and/or focus combined beam 54. Once so collimated or focused, combined beam 54 can illuminate distant objects with intensities that exceed the solar irradiance, at least over a limited bandwidth. Such a projector can thus be used in broad daylight to determined range and or location information of objects external to an aircraft.

Figure 7A:
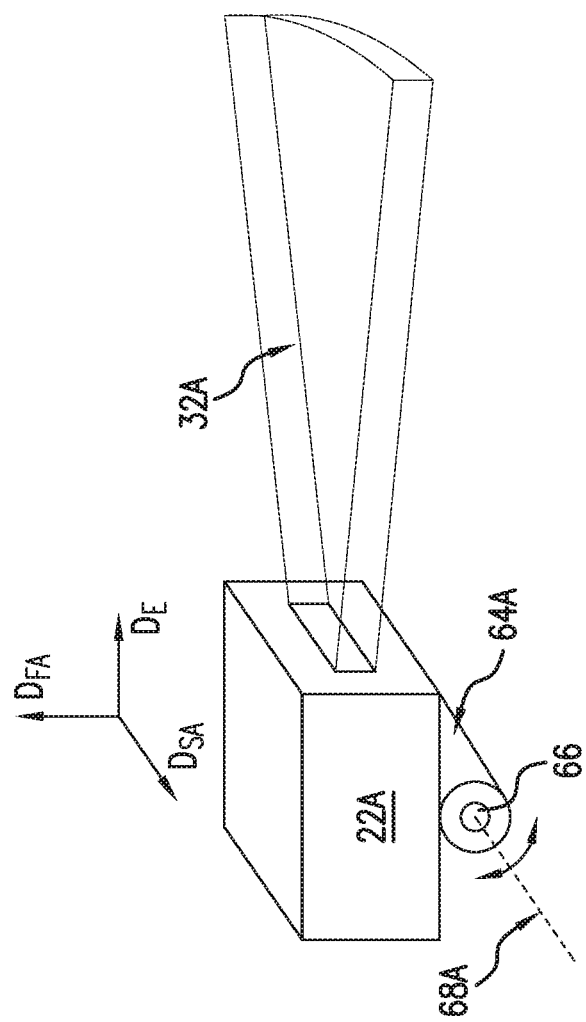
Figure 7C:
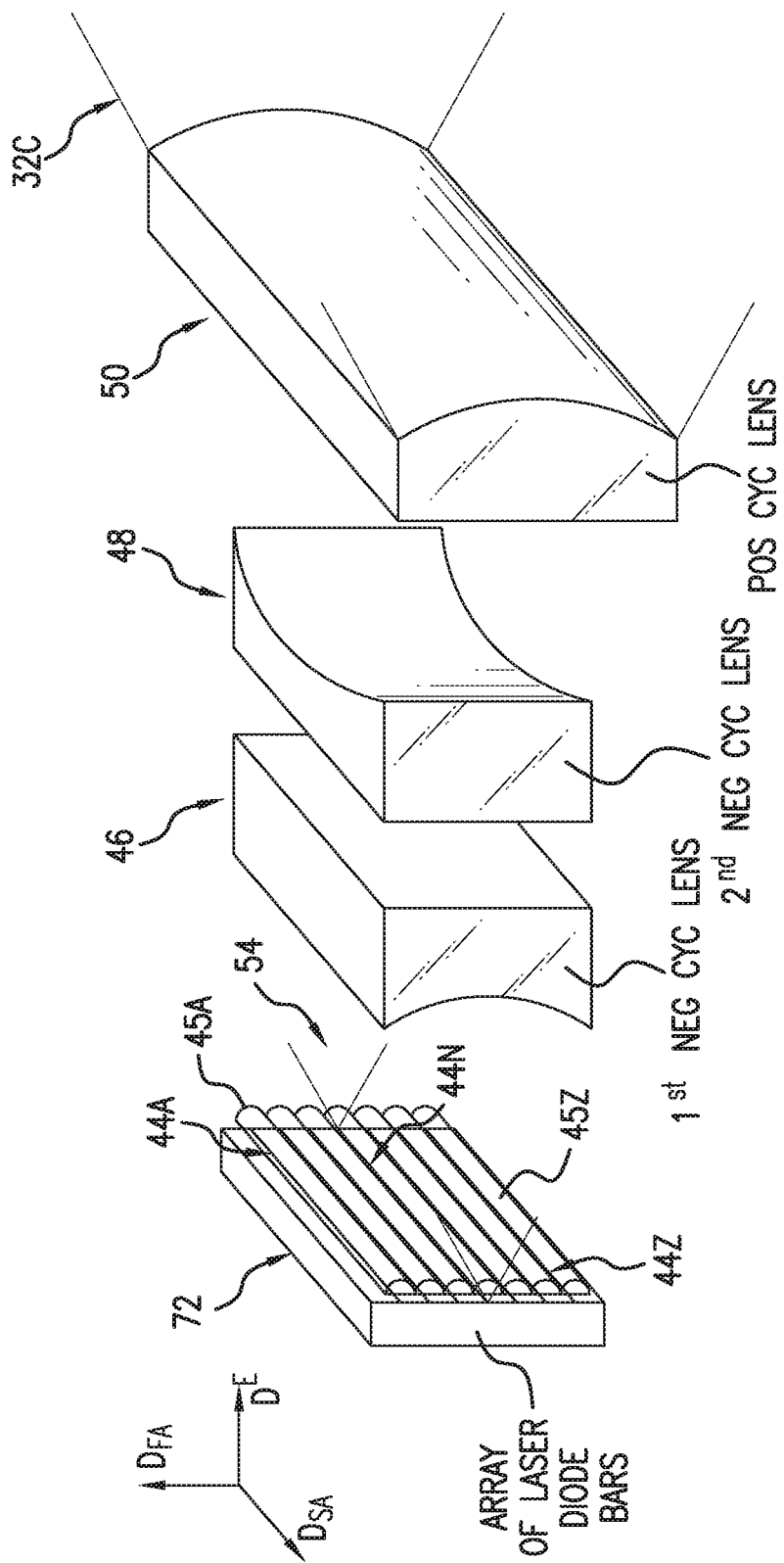

FIGS. 7A-7C depict linear projectors having various scanning mechanisms. In FIG. 7A, linear projector 22A has scanning mechanism 64A, which is configured to mechanically scan linear beam 32A in a fast-axis direction. Scanning mechanism 64A includes rotational member 66, which rotates linear projector 22A about pivot axis 68A. In some embodiments, pivot axis 68A can be parallel to the slow-axis direction $D_{SA}$, as depicted.

In FIG. 7B, linear projector 22B has scanning mechanism 64B, which is configured to optically scan linear beam 32B by reflecting linear beam 32B via rotatable mirror 70. Rotatable mirror 70 is interposed in the path of linear beam 32B. Scanning mechanism 64B is configured to rotate rotatable mirror 70 about rotation axis 68B that is parallel to the slow-axis direction $D_{SA}$. Rotatable mirror 70 scans linear beam 32B in the fast-axis direction (i.e., perpendicular to the linear beam 32B) as it is rotated about rotation axis 68B.

In FIG. 7C, linear projector 22C has electronic scanning capability. Linear projector 22C includes an array of laser diode bar 72 that includes rows of laser diodes 44A-44Z. Each of the laser diodes in a particular row 44A-44Z is aligned along a fast-axis direction with the other laser diodes in that particular row 44A-44Z. Each of the laser diode rows 44A-44Z can be independently energized in turn. In the depicted embodiment laser diode row 44N is energized. Each of the laser diode rows 44A-44Z are configured to generate a linear beam 32C of light that is collimated and/or focused by cylindrical lenses 45A-45N, 46 and 50 in a fast-axis direction $D_{FA}$. The linear beam emitted by each row of laser diodes 44A-44Z is then diverged in a slow axis direction $D_{SA}$, by cylindrical lens 48. For example, the laser diode rows 44A-44Z can be energized in a sequence from top row 44A to bottom row 44Z, so as to generate a corresponding sequence of linear beams focused at different angles of elevation with respect to linear projector 22C.

FIGS. 8A-8B are side-elevation and plan views of an embodiment of an array of independently-controllable laser diode bars, which can be used to scan a linear illumination pattern upon a scene. In FIGS. 8A and 8B, laser diode array 100 includes independently-controllable laser diode bars 102A-102D distributed along a common axis $A_V$. Independently-controllable laser diode bars 102A-102D are aligned so that each of independently-controllable laser diode bars 102A-102D is configured to emit light in a common emission direction $D_E$ orthogonal to the common axis $A_V$.

The beam of light emitted by each of independently-controllable laser diode bars 102A-102D diverges at a first divergence angle in a fast-axis direction $D_{FA}$ parallel to the common axis $A_V$ and orthogonal to the emission direction $D_E$, and diverges at a second divergence angle in a slow-axis direction $D_{SA}$ perpendicular both to the common axis $A_V$ and to the emission direction $D_E$. The second divergence angle is less than the first divergence angle, as is the nature of fast-axis illumination patterns and slow-axis illumination patterns.

Divergence in the fast-axis direction means that the divergence of light about the emission direction in the plane including the emission direction and the fast-axis direction. In other words, it means that a transverse dimension of the light beam parallel to the fast-axis direction increases as the light beam propagates in the direction of emission. Similarly, divergence in the slow-axis direction means that the divergence of light about the emission direction in the plane including the emission direction and the slow-axis direction. In other words, it means that a transverse dimension of the light beam parallel to the slow-axis direction increases as the light beam propagates in the direction of emission.

Laser diode array 100 is formed as a stack of a plurality of plate members 104A-104D. Each of the plurality of plate members 104A-104D has a corresponding one of the array of independently-controllable laser diode bars 102A-102D affixed thereto. The stack of alternating plate members and insulative spacers are aligned such that emission faces, from which the beams of light are emitted, of the array of independently-controllable laser diode bars 102A-102D, are coplanar.

A plurality of insulative spacers 106A-106D provides electrical isolation between adjacent pairs (e.g., between plate members 104B and 104C, etc.) of plate members 104A-104D. Such electrical isolation is obtained by interposing one of insulative spacers 106A-106D between the adjacent pairs of the plurality of plate members 104A-104D. Each of the plurality of insulative spacers 106A-106D isolates the adjacent pairs of the plurality of plate members 104A-104D from one another, so that independently-controllable laser diode bars 102A-102D affixed thereto can be independently energized.

Each of the plurality of plate members 104A-104D has first and second electrical contacts 108A-108D and 110A-110D, respectively. Each of first electrical contacts 108A-108D is in conductive communication with an anode of a corresponding one of the independently-controllable laser diode bar 102A-102D. Each of second electrical contacts 110A-110D is in conductive communication with a cathode of a corresponding one of the independently-controllable laser diode bar 102A-102D.

Plate members 104A-104B have different longitudinal dimensions in the emission direction $D_E$ such that the stack of alternating plate members 104A-104D and insulative spacers 106A-106D form a staircase profile on a contact end opposite an emission end at which the emission faces reside. First and second electrical contacts 108A-108D and 110A-110D, respectively, are formed on exposed steps of the staircase profile, thereby permitting electrical connections thereto. Because pairs of first and second electrical contacts 108A and 110A, 108B and 110B, 108C and 110C, and 108D and 110D are electrically isolated from one another, each of laser diode bars 102A-102D can be independently energized by providing an energizing electrical signal to the corresponding contact pair. In some embodiments switches and/or transistors can be configured to provide switched power to each of the pairs of first and second electrical contacts 108A and 110A, 108B and 110B, 108C and 110C, and 108D and 110D, thereby facilitating independent control of laser diode bars 102A-102D.

FIGS. 9A-9B are side-elevation and plan views of another embodiment of an array of independently-controllable laser diode bars, which can be used to scan a linear illumination pattern upon a scene. In FIGS. 9A and 9B, laser diode array 110 includes independently-controllable laser diode bars 112A-112E distributed along a common axis $A_L$. Independently-controllable laser diode bars 112A-112E are aligned so that each of independently-controllable laser diode bars 112A-112E is configured to emit light in a common emission direction $D_E$ orthogonal to the common axis $A_L$.

The beam of light emitted by each of independently-controllable laser diode bars 112A-112E diverges at a first divergence angle in a fast-axis direction $D_{FA}$ parallel to the common axis $A_L$ and orthogonal to the emission direction $D_E$, and diverges at a second divergence angle in a slow-axis direction $D_{SA}$ perpendicular both to the common axis $A_L$ and to the emission direction $D_E$. The second divergence angle is less than the first divergence angle, as is the nature of fast-axis illumination patterns and slow-axis illumination patterns.

Laser diode array 110 is attached to or formed with single plate member 114 having top and bottom surfaces $S_{TOP}$ and $S_{BOT}$ extending between lateral and transverse ends $E_{LAT1}$-$E_{LAT2}$ and $E_{TRAN1}$-$E_{TRAN2}$. In some embodiments, top surface $S_{TOP}$ is substantially coplanar with emission faces, from which the beams of light are emitted, of the array of independently-controllable laser diode bars. In other embodiments, such as the depicted embodiment, independently-controllable laser diode bars 112A-112E are affixed to top surface $S_{TOP}$, such that the emitted beams of light of the array of independently-controllable laser diode bars, are all directed in the emission direction.

First and second electrical contacts 118A-108E and 120A-120E, respectively, are formed on single plate member 114. Each of first electrical contacts 118A-108E is in conductive communication with an anode of a corresponding one of the independently-controllable laser diode bar 112A-112E. Each of second electrical contacts 120A-120E is in conductive communication with a cathode of a corresponding one of the independently-controllable laser diode bar 112A-112E. In the depicted embodiment, each of independently-controllable laser diode bars 112A-112E is affixed to a copper-tungsten CuW substrate, so as to provide heat dissipation therefrom Discussion of Possible Embodiments The following are non-exclusive descriptions of possible embodiments of the present invention.

Apparatus and associated methods relate to a system for projecting a linear beam of light on a distant object. The system includes an array of independently-controllable laser diode bars distributed along a common axis. Each of the independently-controllable laser diode bars is configured to emit a beam of light in an emission direction orthogonal to the common axis. The emitted beam of light diverges about the emission direction at a first divergence angle in the plane including the emission direction and a fast-axis direction. The emitted beam of light also diverges about the emission direction at a second divergence angle in the plane including the emission direction and a slow-axis direction. The second divergence angle is less than the first divergence angle.

The system of the preceding paragraph can optionally include, additionally and/or alternatively, any one or more of the following features, configurations and/or additional components:

A further embodiment of the foregoing system, wherein each of the independently-controllable laser diode bars includes an anode, a cathode, a first electrical contact in conductive communication with the anode, and a second electrical contact in conductive communication with the cathode.

A further embodiment of any of the foregoing systems, wherein each of the independently-controllable laser diode bars is configured to emit the beam of light in response to an electrical signal supplied to the first and second contacts.

A further embodiment of any of the foregoing systems further includes a plurality of plate members, each having a corresponding one of the array of independently-controllable laser diode bars affixed thereto, and a plurality of insulative spacers. Each of the plurality of insulative spacers is interposed between adjacent ones of the plurality of plate members, thereby forming a stack of alternating plate members and insulative spacers. Each of the plurality of insulative spacers electrically isolates adjacent ones of the plurality of plate members from one another.

A further embodiment of any of the foregoing systems, wherein the stack of alternating plate members and insulative spacers are aligned such that, at an emission end, emission faces, from which the beams of light are emitted, of the array of independently-controllable laser diode bars, are coplanar.

A further embodiment of any of the foregoing systems, wherein the plurality of plate members have different longitudinal dimensions in the emission direction such that the stack of alternating plate members and insulative spacers form a staircase profile on a contact end opposite an emission end at which the emission faces reside. The first and second electrical contacts are formed on exposed steps of the staircase profile, thereby permitting electrical connections thereto.

A further embodiment of any of the foregoing systems, wherein the array of independently-controllable laser diode bars comprises a single plate member having top and bottom surfaces extending from lateral and transverse ends. The array of independently-controllable laser diode bars is affixed to the top surface of the single plate member.

A further embodiment of any of the foregoing systems, wherein each of the array of independently-controllable laser diode bars is affixed to a copper-tungsten substrate, so as to provide heat dissipation therefrom.

A further embodiment of any of the foregoing systems, wherein each of the independently-controllable laser diode bars comprises a plurality of independently-controllable laser diode bars distributed along a common transverse axis parallel to the slow-axis direction.

A further embodiment of any of the foregoing systems further includes a lens stack configured to collimate the beam of light emitted by each of the independently-controllable laser diode bars in the fast-axis direction and diverge the beam of light emitted by each of the independently-controllable laser diode bars in the slow-axis direction.

A further embodiment of any of the foregoing systems, wherein the beam of light emitted by each of the independently-controllable laser diode bars is collimated such that a full-width half-magnitude (FWHM) portion of the emitted beams of light are less than or equal to a predetermined width in the fast-axis direction at a predetermined distance from the system.

A further embodiment of any of the foregoing systems wherein the predetermined distance is 150 meters from the system and the predetermined width is 10 cm.

A further embodiment of any of the foregoing systems, wherein the lens stack includes a first lens configured to collimate and/or focus, in a fast-axis direction, the beam of light emitted by each of the independently-controllable laser diode bars. The lens stack further includes a second cylindrical lens configured to diverge, in a slow-axis direction, the beam of light emitted by each of independently-controllable laser diode bars.

A further embodiment of any of the foregoing systems, wherein the lens stack further includes a third cylindrical lens configured to, in conjunction with the first cylindrical lens, collimate and/or focus in a fast-axis direction the beam of light emitted by each of the independently-controllable laser diode bars.

A further embodiment of any of the foregoing systems, wherein the first lens is spherical, aspherical or cylindrical in shape with convexity in the fast-axis direction.

A further embodiment of any of the foregoing systems, wherein the second cylindrical lens is a concave lens with concavity in the slow-axis direction.

A further embodiment of any of the foregoing systems further includes a scanner configured to sequentially provide an electrical signal to the first and second electrical contact of each of the array of independently-controllable laser diode bars so as to scan the beam emitted by the array of independently-controllable laser diode bars in the fast-axis direction.

A further embodiment of any of the foregoing systems, wherein the emitted beam of light has a nominal wavelength in the infrared band.

A further embodiment of any of the foregoing systems, wherein the emitted beam of light has a wavelength spectral bandwidth of less than 10 nm FWHM.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for projecting a linear beam of light on a distant object, the system comprising:
   an array of independently-energized laser diode bars distributed along a common axis, each of the independently-energized laser diode bars configured to emit a beam of light in an emission direction orthogonal to the common axis, the emitted beam of light diverging about the emission direction at a first divergence angle in the plane including the emission direction and a fast-axis direction, and diverging about the emission direction at a second divergence angle in the plane including the emission direction and a slow-axis direction, wherein the second divergence angle is less than the first divergence angle.

2. The system of claim 1, wherein each of the independently-energized laser diode bars comprises:
   an anode;
   a cathode;
   a first electrical contact in conductive communication with the anode; and
   a second electrical contact in conductive communication with the cathode.

3. The system of claim 2, wherein each of the independently-energized laser diode bars is configured to emit the beam of light in response to an electrical signal supplied to the first and second contacts.

4. The system of claim 2, further comprising:
   a plurality of plate members, each having a corresponding one of the array of independently-energized laser diode bars affixed thereto; and
   a plurality of insulative spacers, each interposed between adjacent ones of the plurality of plate members, thereby forming a stack of alternating plate members and insulative spacers, each of the plurality of insulative spacers electrical isolating adjacent ones of the plurality of plate members from one another.

5. The system of claim 4, wherein the stack of alternating plate members and insulative spacers are aligned such that, at an emission end, emission faces, from which the beams of light are emitted, of the array of independently-energized laser diode bars, are coplanar.

6. The system of claim 5, wherein the plurality of plate members have different longitudinal dimensions in the emission direction such that the stack of alternating plate members and insulative spacers form a staircase profile on a contact end opposite an emission end at which the emission faces reside, wherein the first and second electrical contacts are formed on exposed steps of the staircase profile, thereby permitting electrical connections thereto.

7. The system of claim 2, wherein the array of independently-energized laser diode bars comprises a single plate member having top and bottom surfaces extending from lateral and transverse ends, wherein the array of independently-energized laser diode bars is affixed to the top surface of the single plate member.

8. The system of claim 7, wherein each of the array of independently-energized laser diode bars is affixed to a copper-tungsten substrate, so as to provide heat dissipation therefrom.

9. The system of claim 1, wherein each of the independently-energized laser diode bars comprises a plurality of independently-energized laser diode bars distributed along a common transverse axis parallel to the slow-axis direction.

10. The system of claim 1, further comprising:
    a lens stack configured to collimated the beam of light emitted by each of the independently-energized laser diode bars in the fast-axis direction and diverge the beam of light emitted by each of the independently-energized laser diode bars in the slow-axis direction.

11. The system of claim 10, wherein the beam of light emitted by each of the independently-energized laser diode bars is collimated such that a full-width half-magnitude (FWHM) portion of the emitted beams of light are less than or equal to a predetermined width in the fast-axis direction at a predetermined distance from the system.

12. The system of claim 11, wherein the predetermined distance is 150 meters from the system and the predetermined width is 10 cm.

13. The system of claim 10, wherein the lens stack comprises:
    a first lens configured to collimate and/or focus, in a fast-axis direction, the beam of light emitted by each of the independently-energized laser diode bars; and
    a second cylindrical lens configured to diverge, in a slow-axis direction, the beam of light emitted by each of independently-energized laser diode bars.

14. The system of claim 13, wherein the lens stack further comprises:
    a third cylindrical lens configured to, in conjunction with the first cylindrical lens, collimate and/or focus in a fast-axis direction the beam of light emitted by each of the independently-energized laser diode bars.

15. The system of claim 13, wherein the first lens is spherical, aspherical or cylindrical in shape with convexity in the fast-axis direction.

16. The system of claim 13, wherein the second cylindrical lens is a concave lens with concavity in the slow-axis direction.

17. The system of claim 14, wherein the third cylindrical lens is a convex lens with convexity in the fast-axis direction.

18. The system of claim 2, further comprising:
    a scanner configured to sequentially provide an electrical signal to the first and second electrical contact of each of the array of independently-energized laser diode bars so as to scan the beam emitted by the array of independently-energized laser diode bars in the fast-axis direction.

19. The system of claim 1, wherein the emitted beam of light has a nominal wavelength in the infrared band.

20. The system of claim 1, wherein the emitted beam of light has a wavelength spectral bandwidth of less than 10 nm FWHM.

\* \* \* \* \*